United States Patent
Bromley et al.

(10) Patent No.: US 6,739,132 B2
(45) Date of Patent: May 25, 2004

(54) THERMAL MICRO-ACTUATOR BASED ON SELECTIVE ELECTRICAL EXCITATION

(75) Inventors: Susan C. Bromley, Bloomington, MN (US); Bradley J. Nelson, North Oaks, MN (US); Karl Vollmers, Crystal, MN (US); Arunkumar Subramanian, Minneapolis, MN (US); Eniko Enikov, Tucson, AZ (US); Kamal Deep Mothilal, Minneapolis, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 45 days.

(21) Appl. No.: 10/137,771

(22) Filed: Apr. 30, 2002

(65) Prior Publication Data
US 2003/0200749 A1 Oct. 30, 2003

(51) Int. Cl.⁷ .............................................. F01B 29/10
(52) U.S. Cl. ............................. 60/527; 60/528; 310/306
(58) Field of Search ....................... 60/527, 528, 529; 310/306, 307, 309

(56) References Cited

U.S. PATENT DOCUMENTS

| | | | |
|---|---|---|---|
| 4,423,401 A | 12/1983 | Mueller | |
| 5,343,422 A | 8/1994 | Kung et al. | 365/173 |
| 5,347,485 A | 9/1994 | Taguchi et al. | 365/171 |
| 5,477,482 A | 12/1995 | Prinz | 365/129 |
| 5,541,868 A | 7/1996 | Prinz | 365/98 |
| 5,640,343 A | 6/1997 | Gallagher et al. | 365/171 |
| 5,650,958 A | 7/1997 | Gallagher et al. | 365/173 |
| 5,734,605 A | 3/1998 | Zhu et al. | 365/173 |
| 5,909,078 A | 6/1999 | Wood et al. | |
| 5,949,707 A | 9/1999 | Pohm et al. | 365/158 |
| 5,955,817 A | 9/1999 | Dhuler et al. | |
| 5,959,376 A | 9/1999 | Allen | |
| 5,966,322 A | 10/1999 | Pohm et al. | 365/158 |
| 5,978,257 A | 11/1999 | Zhu et al. | 365/173 |
| 5,994,816 A | 11/1999 | Dhuler et al. | |
| 6,021,065 A | 2/2000 | Daughton et al. | 365/173 |
| 6,067,797 A | 5/2000 | Silverbrook | |
| 6,114,794 A | 9/2000 | Dhuler et al. | |
| 6,124,711 A | 9/2000 | Tanaka et al. | 324/252 |
| 6,147,900 A | 11/2000 | Pohm | 365/158 |
| 6,211,598 B1 | 4/2001 | Dhuler et al. | |
| 6,275,325 B1 | 8/2001 | Sinclair | 359/291 |
| 6,275,411 B1 | 8/2001 | Daughton et al. | 365/158 |
| 6,410,361 B2 * | 6/2002 | Dhuler et al. | 310/307 |
| 6,438,954 B1 * | 8/2002 | Goetz et al. | 60/527 |
| 6,485,273 B1 * | 11/2002 | Goodwin-Johansson | 310/309 |
| 2001/0010488 A1 | 8/2001 | Minners | 337/131 |

FOREIGN PATENT DOCUMENTS

WO   WO 02/23574 A1   3/2002

OTHER PUBLICATIONS

Comtois, J. et al., "Characterization of Electrothermal Actuators and Arrays Fabricated in a Four–Level, Planarized Surface–Micromachined Polycrystalline Silicon Process", *IEEE, Transducers* '97, 0–7803–3829–4, pp. 769–772 (1997).

Sun, X. et al., "A Bistable Microrelay Based on Two–Segment Multimorph Cantilever Actuators", *IEEE*, 0–7803–4412–X, pp. 154–159 (1998).

A. Veloso and P.P. Freitas. Spin Valve Sensors with Synthetic Free and Pinned Layers. *Journal of Applied Physics*, vol. 87 No. 9, 5744–5746, May 1, 2000.

(List continued on next page.)

Primary Examiner—Sheldon J. Richter
(74) Attorney, Agent, or Firm—Merchant & Gould P.C.

(57) ABSTRACT

A thermal microactuator is provided that can be deflected in multiple positions. The actuator has a hot arm and a cold arm coupled together at their distal ends suspended above a reference plane of a substrate. A potential difference is applied across the hot arm so that a current circulates through the hot arm but not the cold arm.

26 Claims, 3 Drawing Sheets

OTHER PUBLICATIONS

A. Veloso, P.P. Freitas, and L. V. Melo. Spin Valves with Synthetic Ferrimagnet and Antiferromagnet Free and Pinned Layers. IEEE Trans. Magn. 35, 2568 (1999).

V.S. Speriosu, B.A. Gurney, D.R. Wilhoit, and L.B. Brown. Spin Valves with Synthetic Ferrimagnets. Presented at Intermag '96.

Hoffman, M. et al., "Bistable micromechanical fiber–optic switches on silicon with thermal actuators," *Sensors and Actuators*, vol. 78, pp. 28–35 (1999).

Kolesar, E. et al., "In–plane tip deflection and force achieved with asymmetrical polysilicon electrothermal microactuators, " *Thin Solid Films*, vol. 5 377–378, pp. 719–726 (2000).

Matoba, H. et al., "A Bistable Snapping Microactuator," *Micro Electro Mechanical Systems, MEM '94, Proceedings, IEEE Workshop on OISO, Japan*, pp. 45–50 (Jan. 25–28, 1994).

* cited by examiner

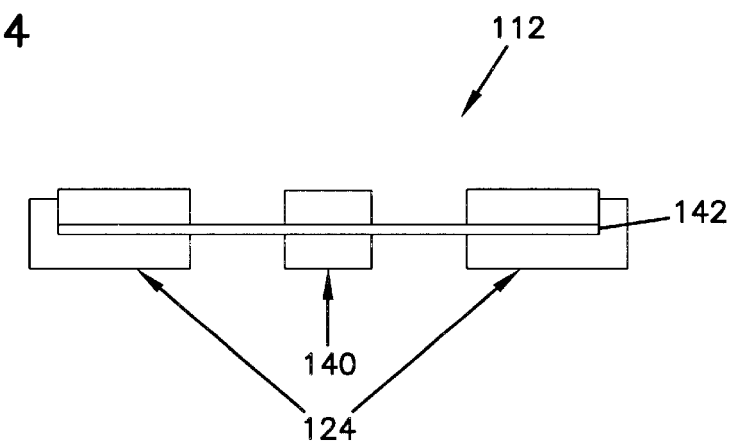
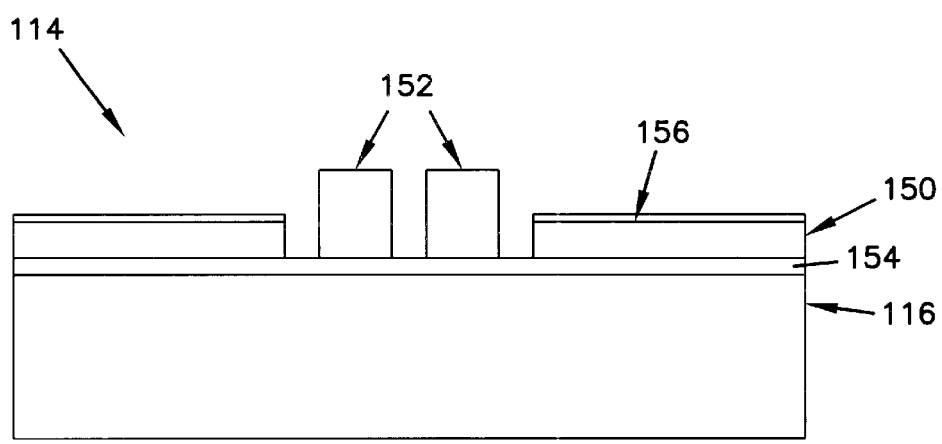

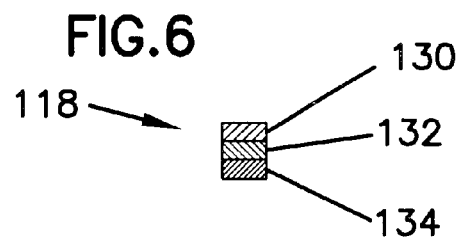
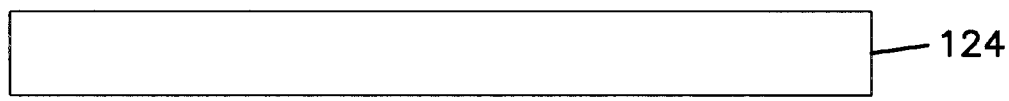
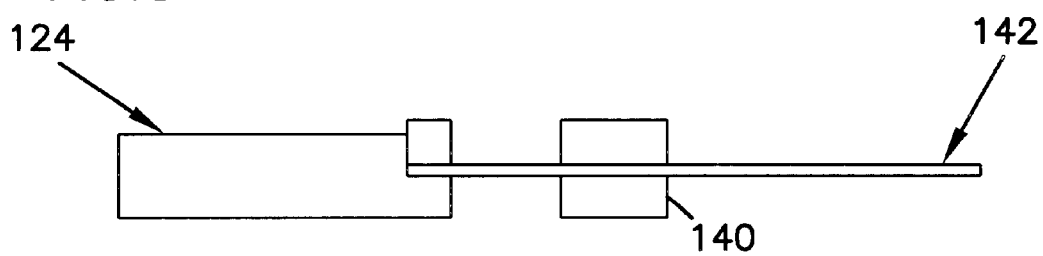

THERMAL MICRO-ACTUATOR BASED ON SELECTIVE ELECTRICAL EXCITATION

BACKGROUND OF THE INVENTION

Microelectromechanical systems (MEMS) have recently been developed as alternatives for conventional electromechanical devices such as relays, actuators, valves and sensors. MEMS devices are potentially low cost devices due to the use of microelectronic fabrication techniques. New functionality may also be provided because MEMS devices can be much smaller than conventional electromechanical devices.

Many applications of MEMS technology use MEMS actuators. For example, many sensors, valves and positioners use actuators for movement.

MEMS devices have relied upon various techniques to provide the force necessary to cause the desired motion within the microstructures. For example, cantilevers have been employed to transmit mechanical force in order to rotate micromachined springs and gears. In addition, some micromotors are driven by electromagnetic fields, while other micromachined structures are activated by piezoelectric or electrostatic forces. Recently, MEMS devices that are actuated by the controlled thermal expansion of an actuator or other MEMS components have been developed.

There are two fundamental techniques for electro-thermal actuation. One technique uses a bimorph structure, i.e., a cantilever beam made of two different materials, and the other uses two arms, or beams, of varying cross-sectional area connected at a distal end as shown in FIG. 1. When current is passed in the two arms, the arms elongate to different lengths because of their different cross-sections and thus deflect the distal end of the actuator in one direction as shown in FIG. 2. With reference to FIG. 1, the actuator 10 has a hot arm 12 which is the thinner arm and a cold arm 14. The terms hot and cold are used in a relative sense. As shown by the arrow, because the hot arm 12 is smaller in cross-section than the cold arm 14, it has a higher resistance and thus heats up and expands more to cause the distal end 16 of the actuator to bend in one direction. Thermally actuated MEMS devices that rely on thermal expansion of the actuator have recently been developed to provide for actuation in-plane, i.e., displacement along a plane generally parallel to the surface of the microelectronic substrate.

Notwithstanding the MEMS actuators that have previously been proposed, a number of existing and contemplated MEMS systems, such as relays, actuators, valves and sensors require more sophisticated actuators that provide useful forces and displacements while consuming reasonable amounts of power in an efficient manner. Since it is desirable that the resulting MEMS systems be fabricated with batch processing, it is also preferred that the microelectronic fabrication techniques for manufacturing the resulting MEMS systems be affordable, repeatable and reliable.

It is desirable to provide an actuator that increases and improves the displacement produced by thermal actuation techniques. In addition, it is desirable to provide an actuator that can be deflected in multiple directions.

SUMMARY OF THE INVENTION

According to a first aspect of the invention, there is provided a microelectromechanical structure. The structure includes a substrate, a first beam, a second beam and a connector. The substrate defines a reference plane. The first beam has a proximal end and a distal end. The proximal end of the first beam is coupled to the substrate wherein the first beam extends in a first plane parallel with the reference plane. The first beam includes three layers including a dielectric layer sandwiched between two conductive layers. The second beam also has a proximate and a distal end. The proximal end of the second beam is coupled to the substrate wherein the second beam extends in the first plane parallel with the reference plane. The connector defines a distal end of the structure and couples the distal end of the first beam to the distal end of the second beam. A potential difference is applied between the two conductive layers of the first beam so that current flows into one conductive layer and out the other conductive layer and no potential difference is applied across the second beam.

According to a second aspect of the invention, there is provided a microelectromechanical structure. The structure includes a substrate and an actuator. The substrate defines a reference plane. The actuator has a portion thereof suspended above the reference plane of the substrate. The actuator includes a hot arm having a distal end, the hot arm is made of three layers including a dielectric layer sandwiched between two conductive layers and a cold arm having a distal end which is coupled to the distal end of the hot arm. A potential difference is applied across the hot arm so that a current circulates through the conductive layers of the hot arm to cause the hot arm to expand and move the distal ends of the hot and cold arms towards the contact located on the substrate.

According to a third aspect of the invention, there is provided a microelectromechanical device. The device includes a substrate, a first beam, a second beam and a connector. The substrate defines a reference plane. The first beam has a proximal and a distal end. The proximal end of the first beam is coupled to the substrate wherein the first beam extends in a plane parallel with the reference plane. The first beam is formed by a three layer structure having a dielectric layer sandwiched between two conductive layers. The second beam has a proximal and a distal end. The proximal end of the second beam is coupled to the substrate wherein the second beam extends in a plane parallel with the reference plane. The second beam is formed by a three layer structure having a dielectric layer sandwiched between two conductive layers. The connector couples the distal end of the first beam to the distal end of the second beam. A potential difference is applied across the first beam and no potential difference is applied across the second beam, thereby causing greater thermal expansion in the first beam resulting in deflection of the distal ends of the first and second beams.

For a further understanding of the nature and advantages of the present invention, as well as the preferred mode of use, reference should be made to the following detailed description read in conjunction with the accompanying drawings. In the following drawings, like reference numerals designate like or similar parts throughout the drawings.

BRIEF DESCRIPTION OF THE DRAWINGS

FIG. 4 is a cross-sectional view of the actuator shown in FIG. 3 taken along line 4—4.

FIG. 5 is a cross-sectional view of the actuator shown in FIG. 3 taken along line 5—5.

FIG. 6 is a cross-sectional view of the actuator shown in FIG. 3 taken along line 6—6.

FIG. 7 is a cross-sectional view of the actuator shown in FIG. 3 taken along line 7—7.

FIG. 8 is a cross-sectional view of the actuator shown in FIG. 3 taken along line 8—8.

DETAILED DESCRIPTION OF THE PRESENTLY PREFERRED EMBODIMENTS

Figure 1:
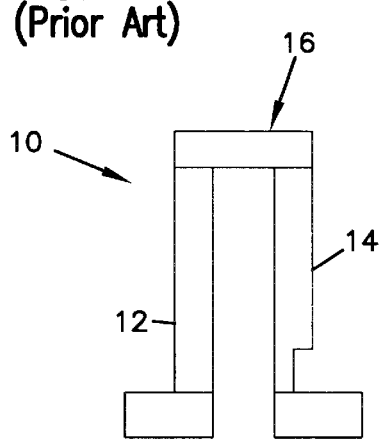
FIG. 1 is a top plan view of an thermal actuator based on varying cross-section according to the prior art.
Figure 2:
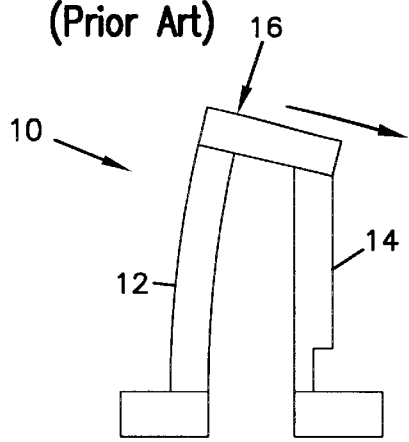
FIG. 2 is a top plan view of the thermal actuator shown in FIG. 1 activated.
Figure 3:
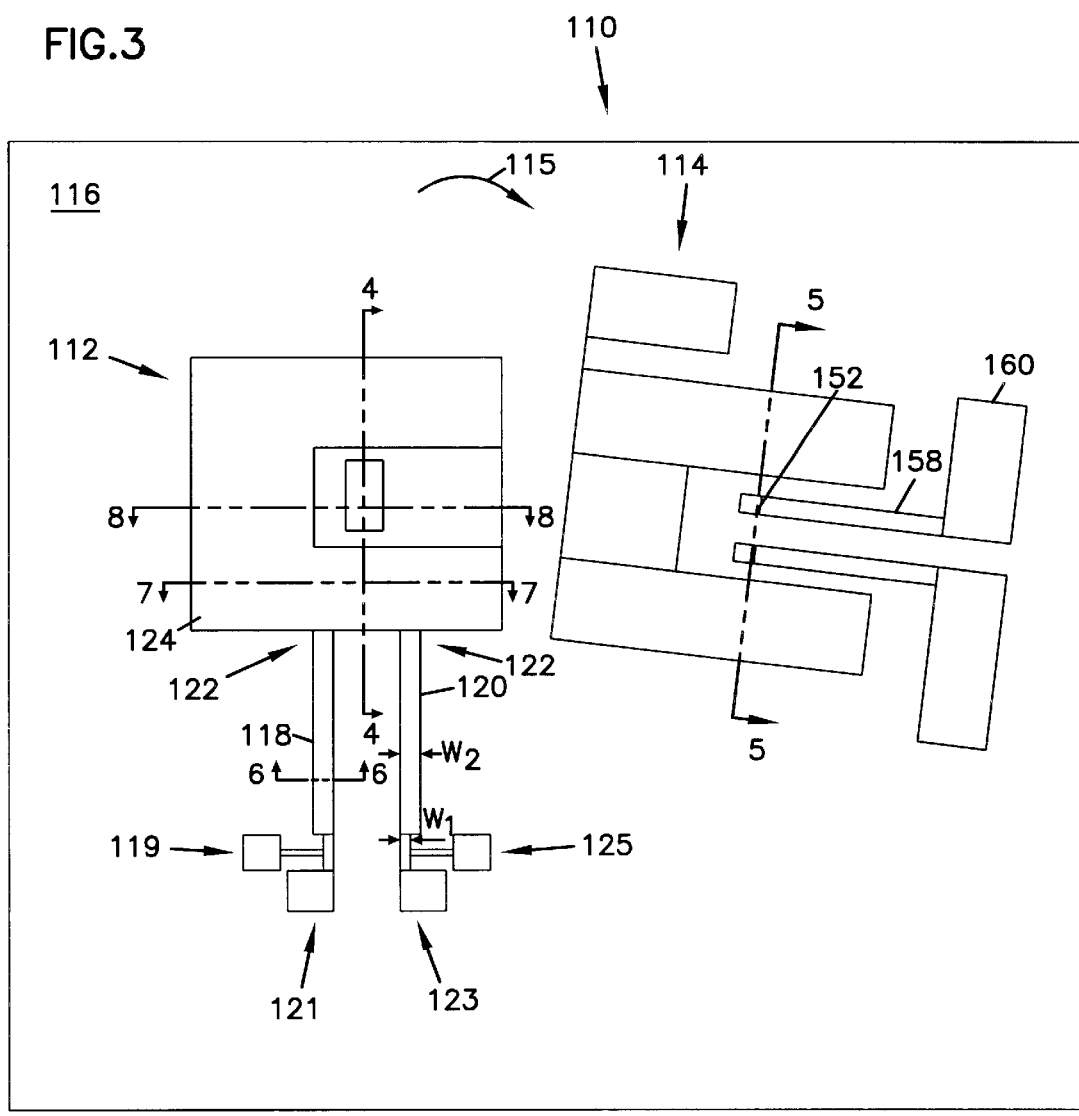
FIG. 3 is a schematic of an thermal actuator system according to a preferred embodiment of the present invention.

FIG. 3 is a schematic view of a thermal actuator system 110 according to a preferred embodiment of the present invention. The actuator system 110 is formed on a substrate 116 and includes a thermal actuator 112 and a contact platform 114. The thermal actuator 112 includes a first beam 118 or arm and a second beam 120 or arm which will be described in greater detail hereinafter. Each beam has a distal end 122 that is coupled together by an upper electrode 124 (see FIG. 7). At the proximal end of each beam is a support (not shown) that is formed on the substrate 116. Extending from the first and second beams 118, 120 are contact pads 119, 121, 123, 125 which are used to couple portions of each beam 118, 120 to an electrical source. The first and second beams 118, 120 are coupled to the support and extend above the substrate 116 in a first plane parallel to the plane of the substrate 116.

The first and second beams 118, 120 and upper electrode 124 extend in a plane parallel with the plane of the substrate 116 but in a different plane so that the beams 118, 120 and upper electrode 124 float above the substrate 116.

Referring to the cross-sectional view of the first beam 118 shown in FIG. 6, the first beam 118 is formed of three layers. The beam 118 includes two conductive or semi-conductive layers 130, 134 and a dielectric layer 132 sandwiched between the conductive layers 130, 134. In a preferred embodiment, the conductive layers 130, 134 are made of a metal. The dielectric layer 132 is preferably made of silicon dioxide. Of course other materials may be used.

The second beam 120 may have an identical structure as the first beam 118 or, alternatively, as will be described hereinafter, it may be formed of a single material instead of a three-layer structure. The upper electrode 124 is preferably made of a conductive or semi-conductive material.

As can be seen in FIG. 3, the proximal portions of the first and second beams 118, 120 have a width $W_1$ respectively, that is smaller than the width $W_2$ of the distal portions of the beams. The smaller widths $W_1$ at the proximal portions of the beams 118, 120 creates a thermal bottleneck which improves deflection of the distal region of the actuator as will be described in detail hereinafter. In addition, the beams 118, 120 in the proximal region are easier to bend. In a preferred embodiment the proximal portions of beams 118, 120 are about half to about a quarter the width of the distal portions of the beams 118, 120. In a more preferred embodiment, $W_1$ is about $\frac{3}{5}^{th}$ of $W_2$.

FIG. 4 is a cross-sectional view of the actuator shown in FIG. 3 taken along line 4—4. The actuator 112 has a contact bar 140 which is preferably made of a conductive or semi-conductive material. Three sides of the contact 140 are surrounded by, but isolated from, the upper electrode 124. A dielectric layer 142 lies atop the contact 140 and upper electrode 124 and mirrored features of the contact and upper electrode are formed on the dielectric layer 142 for structural support. FIGS. 7 and 8 are cross-sectional views through other portions of the actuator 112 shown in FIG. 3.

The contact platform 114 with reference to FIG. 3 and the cross-sectional view shown in FIG. 5 includes a lower electrode 150 and a pair of spaced apart contacts 152. The lower electrode 150 is formed on the substrate and separated therefrom by an insulating layer 154. The pair of contacts 152 are also formed on the insulating layer 154. A second insulating layer 156 is formed on the lower electrode 150. The spaced apart contacts 152 are coupled to traces 158 that extend to contact pads 160.

The operation of the actuator system will now be described.

The conductive or semi-conductive layers of each arm 118, 120 are each, individually, coupled to a potential source. More particularly, the pads 119, 121, 123, 125 are used to electrically couple the conductive portions of each arm 118, 120 as will be described in detail.

By properly selecting the electric potential applied to the first beam 118, the second beam 120 and upper electrode 124, current is made to flow in one beam but not the other. More particularly, a potential difference can be applied across beam 118 so that current is made to flow through one of the conductive layers 130 of the beam and return through the other conductive layer 134 of the same beam, while no potential difference is applied across the other beam 120 so that no current flows through that beam. For example, coupling pad 119, which is coupled to the top conductive layer of arm 118, to a source of 10 volts and pad 121, which is coupled to the lower conductive layer of arm 118, to ground, and coupling pads 123, 125 to 5 volts and upper electrode 124 to 5 volts, current flows in arm 118 from the top conductive layer through the bottom conductive layer whereas no current flows in arm 120 since there is no potential difference across its conductive layers. Of course other potentials may be used. Current running through one of the beams selectively heats that beam and causes that beam to elongate while the other beam does not or only does to a lesser extent, thereby deflecting the distal end of the actuator in one direction as shown by arrow 115. Switching the potential difference to the other beam causes deflection of the tip of the actuator in an opposite direction. Thus, the actuator has three stable configurations, a neutral position as shown in FIG. 3, a position to the left and a position to the right. When the actuator 112 is deflected over the contact platform 114, the contact bar 140 at the distal end of the actuator 112 bridges across the pair of contacts 152 on the substrate to close the conductive path formed by conductive traces 158.

If the actuator is being used as a relay, a potential is applied to the lower electrode 150 when the distal end of the actuator 112 is brought over the lower electrode 150, and an electrostatic force latches the actuator 112 to that particular electrode.

Thus, the actuator 112 allows deflection to both the left and the right. If deflection in only one direction is desired, i.e., to the left or to the right, one of the beams may be formed of purely a single material like polysilicon which has a low coefficient of thermal expansion. The use of polysilicon decreases the increment in length of that beam and thus increases the overall deflection of the actuator 112. ANSYS simulations indicate that a deflection of 28.4 microns can be achieved where one beam was formed of a gold, polyimide, gold combination and the other beam was formed of polysilicon. It has been found that in micro relays, the isolation between contact cross bar and lower contacts improves by having the lower electrode contacts 124, 126 oriented at an angle with respect to the cross bar. The final deflected position of the actuator is in agreement with this arrangement. Of course at higher deflections the angle needs to be increased. Larger deflections also mean that a required deflection can be obtained at lower maximum temperature and at lower stresses which increase the life of the actuator.

The present invention should not be considered limited to the particular examples described above, but rather should be understood to cover all aspects of the invention as fairly set out in the claims. Various modifications, equivalent processes, as well as numerous structures to which the present invention may be applicable will be readily apparent to those of skill in the art to which the present invention is directed upon review of the subject specification.

What is claimed is:

1. A microelectromechanical structure comprising:
   a substrate defining a reference plane;
   a first beam having a proximal end and a distal end, the first beam having a first width adjacent to the proximal end and a second greater width adjacent to the distal end, the proximal end of the first beam coupled to the substrate wherein the first beam extends in a first plane parallel with the reference plane, wherein the first beam comprises three layers including a dielectric layer sandwiched between two conductive layers;
   a second beam having a proximate and a distal end, the proximal end of the second beam coupled to the substrate wherein the second beam extends in the first plane parallel with the reference plane; and
   a connector defining a distal end of the structure, the connector coupling the distal end of the first beam to the distal end of the second beam;
   wherein a potential difference is applied between the two conductive layers of the first beam so that current flows into one conductive layer and out the other conductive layer and no potential difference is applied across the second beam.

2. The structure of claim 1 wherein the second beam is made of polysilicon.

3. The structure of claim 1 wherein the first width is half of the second width.

4. The structure of claim 1 wherein the first width is about a quarter of the second width.

5. The structure of claim 1 wherein the second beam has a first width in a proximal region and a second width in a distal region wherein the first width is less than the second width.

6. The structure of claim 1 further comprising:
   a first electrode located at the distal end of the actuator; and
   a second electrode located on the substrate wherein when current is applied to the first beam, the structure bends so that the first electrode lies above the second electrode; and
   means for applying a potential different between the first and second electrode so that an electrostatic force latches the connector at the distal end of the substrate to the substrate.

7. The structure of claim 1 wherein the conductive layers are gold and the dielectric layer is polyimide.

8. The structure of claim 1 wherein the connector is made of a conductive material.

9. The structure of claim 1 wherein the second beam comprises three layers including a dielectric layer sandwiched between two conductive layers.

10. The structure of claim 9 wherein the dielectric layer of each of the first and second beams is made of polyamide.

11. The structure of claim 9 wherein the conductive material is gold.

12. A microelectromechanical structure comprising:
    a substrate defining a reference plane;
    a first beam having a proximal end and a distal end, the proximal end of the first beam coupled to the substrate wherein the first beam extends in a first plane parallel with the reference plane, wherein the first beam comprises three layers including a dielectric layer sandwiched between two gold conductive layers;
    a second beam having a proximate and a distal end, the proximal end of the second beam coupled to the substrate wherein the second beam extends in the first plane parallel with the reference plane, wherein the second beam comprises three layers including a dielectric layer sandwiched between two gold conductive layers; and
    a connector defining a distal end of the structure, the connector coupling the distal end of the first beam to the distal end of the second beam;
    wherein a potential difference is applied between the two gold conductive layers of the first beam so that current flows into one conductive layer and out the other conductive layer and no potential difference is applied across the second beam.

13. A microelectromechanical structure comprising:
    a substrate defining a reference plane; and
    an actuator, the actuator including:
      a first beam having a proximal end and a distal end, the proximal end of the first beam coupled to the substrate wherein the first beam extends in a first plane parallel with the reference plane, wherein the first beam comprises three layers including a dielectric layer sandwiched between two conductive layers;
      a second beam having a proximate and a distal end, the proximal end of the second beam coupled to the substrate wherein the second beam extends in the first plane parallel with the reference plane; and
      a connector coupling the distal end of the first beam to the distal end of the second beam, the connector further including:
        an actuator electrode located that the distal ends of the first and second beams; and
        a substrate electrode located on the substrate, wherein when current is applied to the first beam, the actuator bends so that the actuator electrode lies above the substrate electrode; and
      wherein a first potential difference is applied across the two conductive layers of the first beam so that current flows into one conductive layer and out the other conductive layer and no potential difference is applied across the second beam, and wherein a second potential difference is applied between the substrate and actuator electrodes so that an electrostatic force latches the connector of the actuator to the substrate.

14. A microelectromechanical structure comprising:
    a substrate defining a reference plane;
    an actuator having a portion thereof suspended above the reference plane of the substrate, the actuator comprising:
      a hot arm having a distal region and a proximal region, the hot arm including three layers including a dielectric layer sandwiched between two conductive layers, the hot arm having a first width in the proximal region and a second width in the distal region, the first width being less than the second width;

a cold arm having a distal region coupled to the distal region of the hot arm;

wherein a potential difference is applied across the hot arm so that a current circulates through the conductive layers of the hot arm to cause the hot arm to expand and move the distal regions of the hot and cold arms towards the contact located on the substrate.

15. The structure of claim 14 wherein the first width is half of the second width.

16. The structure of claim 14 wherein the first width is about a quarter of the second width.

17. A microelectromechanical structure comprising:

a substrate defining a reference plane;

an actuator having a portion thereof suspended above the reference plane of the substrate, the actuator comprising:
- a hot arm having a distal end, the hot arm is made of three layers including a dielectric layer sandwiched between two conductive layers;
- a cold arm having a distal end which is coupled to the distal end of the hot arm, the cold arm being position in a generally parallel orientation relative to the hot arm;

wherein a potential difference is applied across the hot arm so that a current circulates through the conductive layers of the hot arm to cause the hot arm to expand and move the distal ends of the hot and cold arms towards the contact located on the substrate.

18. The structure of claim 17 wherein the cold arm is made of three layers including a dielectric layer sandwiched between two conductive layers.

19. The structure of claim 17 further comprising a connector made of a conductive material coupling the distal ends of the hot and cold arms.

20. The structure of claim 17 wherein the two conductive layers of the hot arm are formed of a single material.

21. The structure of claim 20 wherein the cold arm is formed of polysilicon.

22. The structure of claim 17 wherein the hot arm has a first width in a proximal region and a second width in a distal region wherein the first width is less than the second width.

23. The structure of claim 22 wherein the first width is half of the second width.

24. The structure of claim 22 wherein the first width is about a quarter of the second width.

25. A microelectromechanical device comprising:

a substrate defining a reference plane;

a first beam having a proximal and a distal end, the proximal end of the first beam coupled to the substrate wherein the first beam extends in a plane parallel with the reference plane, the first beam formed by a three layer structure having a dielectric layer sandwiched between two conductive layers;

a second beam having a proximal and a distal end, the proximal end of the second beam coupled to the substrate wherein the second beam extends in a plane parallel with the reference plane, the second beam formed by a three layer structure having a dielectric layer sandwiched between two conductive layers;

a connector coupling the distal end of the first beam to the distal end of the second beam;

wherein a first potential difference selectively applied across the first beam and no potential difference applied across the second beam, causes greater thermal expansion in the first beam resulting in deflection of the distal ends of the first and second beams in a first direction; and wherein a second potential difference selectively applied across the second beam and no potential difference applied across the first beam causes greater thermal expansion in the second beam resulting in deflection of the distal ends of the first and second beams in a second opposite direction.

26. The device of claim 25 wherein the first and second beams are positioned in a neutral position when no potential difference is applied across either one of the first and second beams, and selective application of one of the first and second potential differences to the respective first and second beams results in deflection of the distal ends of the first and second beams from the neutral position to the respective first and second directions.

* * * * *